(12) United States Patent
Chiu et al.

(10) Patent No.: US 10,993,058 B2
(45) Date of Patent: Apr. 27, 2021

(54) MANUFACTURING METHOD FOR DIAMOND-LIKE CARBON VIBRATING DIAPHRAGM AND LOUDSPEAKER

(71) Applicant: 1MORE INC, Guangdong (CN)

(72) Inventors: Shihchia Chiu, Guangdong (CN); Lei Yang, Guangdong (CN); Tsangchiang Yang, Guangdong (CN)

(73) Assignee: 1MORE INC

( * ) Notice: Subject to any disclaimer, the term of this patent is extended or adjusted under 35 U.S.C. 154(b) by 0 days.

(21) Appl. No.: 16/488,802

(22) PCT Filed: Feb. 28, 2017

(86) PCT No.: PCT/CN2017/075106
§ 371 (c)(1),
(2) Date: Aug. 26, 2019

(87) PCT Pub. No.: WO2018/157274
PCT Pub. Date: Sep. 7, 2018

(65) Prior Publication Data
US 2020/0068329 A1  Feb. 27, 2020

(51) Int. Cl.
*H04R 31/00* (2006.01)
*C23C 16/26* (2006.01)
(Continued)

(52) U.S. Cl.
CPC .......... *H04R 31/003* (2013.01); *C23C 16/26* (2013.01); *C23C 16/50* (2013.01); *H04R 9/025* (2013.01);
(Continued)

(58) Field of Classification Search
CPC combination set(s) only.
See application file for complete search history.

(56) References Cited

U.S. PATENT DOCUMENTS 5,942,854 A * 8/1999 Ryoji ................ H01J 37/32009
                                                        315/111.21
6,653,212 B1 * 11/2003 Yamanaka .......... C23C 16/0236
                                                        118/723 VE
(Continued)

FOREIGN PATENT DOCUMENTS

CN     101649450 A      2/2010
CN     101886252 A     11/2010
(Continued)

OTHER PUBLICATIONS

European Search Report dated Oct. 21, 2020, in European patent application 17898586.7, 6 pages.
(Continued)

*Primary Examiner* — Fan S Tsang
*Assistant Examiner* — Angelica M McKinney
(74) *Attorney, Agent, or Firm* — Blueshift IP, LLC; Robert Plotkin

(57) ABSTRACT

The present invention relates to a manufacturing method for a diamond-like carbon diaphragm, comprising the steps of: placing a base material in the air; a step of depositing a composite diamond-like carbon diaphragm comprises: importing a carbon-containing gas from one end of an atmospheric pressure plasma chemical vapor deposition device, importing a main gas from the other end of the atmospheric pressure plasma chemical vapor deposition device; bringing the ionized carbon-containing gas out of the atmospheric pressure plasma chemical vapor deposition device by the main gas and depositing the same on the surface of the base material to form a composite diamond-like carbon diaphragm; a step of forming a diamond-like carbon vibrating diaphragm comprises: cutting from the composite diamond-like carbon diaphragm a diamond-like carbon vibrating diaphragm having the required diameter,
(Continued)

forming a diamond-like carbon vibrating diaphragm having the required shape by means of a compressing process.

6 Claims, 4 Drawing Sheets

(51) Int. Cl.
 *C23C 16/50* (2006.01)
 *H04R 9/02* (2006.01)
 *H04R 9/06* (2006.01)

(52) U.S. Cl.
 CPC ......... *H04R 9/06* (2013.01); *H04R 2307/023* (2013.01)

(56) References Cited

U.S. PATENT DOCUMENTS

| | | | | |
|---|---|---|---|---|
| 7,011,866 | B1* | 3/2006 | Yamanaka | C23C 16/24 427/255.28 |
| 2016/0381460 | A1* | 12/2016 | Chiang | H04R 7/125 381/426 |
| 2017/0047221 | A1* | 2/2017 | Harada | H01L 21/02115 |

FOREIGN PATENT DOCUMENTS

| | | | |
|---|---|---|---|
| CN | 102390607 | A | 3/2012 |
| CN | 102560413 | * | 7/2012 |
| CN | 102560413 | A | 7/2012 |
| CN | 204929219 | U | 12/2015 |
| CN | 105263089 | A | 1/2016 |
| CN | 105283581 | A | 1/2016 |
| CN | 105937022 | A | 9/2016 |
| DE | 102016200367 | B3 | 2/2017 |
| JP | 2010115817 | A | 5/2010 |
| KR | 19990002102 | A | 1/1999 |

OTHER PUBLICATIONS

Lin ChiiRuey et al., "Improving the high frequency response of a loudspeaker using hydrogen-free diamond-like carbon film coating at low teperarture," Science China Physidcs, Mechanics and Astronomy, SP Science China Press, Heidelberg, vol. 55, No. 3, Feb. 13, 2012, pp. 385-391.

* cited by examiner

MANUFACTURING METHOD FOR DIAMOND-LIKE CARBON VIBRATING DIAPHRAGM AND LOUDSPEAKER

CROSS REFERENCE TO RELATED APPLICATIONS

This application is a national stage for International Application PCT/CN2017/075106 filed on Feb. 28, 2017, the entire content of which is incorporated in its entirety.

TECHNICAL FIELD

The present disclosure relates, in particular, to a method of manufacturing a diamond-like carbon vibrating diaphragm and a loudspeaker.

BACKGROUND

Diamond-Like Carbon (DLC) technology was developed in the early 1970s, which is essentially a hydrogen-containing amorphous carbon diaphragm. Since DLC has properties similar to those of natural diamonds, such as high hardness, good corrosion resistance, smooth surface, low friction coefficient, good abrasion resistance, good biocompatibility, etc., it can be used on a vibrating diaphragm of a speaker to extend its high frequency. However, since a twisted sp3 bond is included in the molecular structure thereof, the internal stress is high, and adhesion is often poor, and some problems such as cracking and peeling are likely to occur.

Plasma enhanced chemical vapor deposition (PECVD) and physical vapor deposition (PVD) are commonly used in the conventional manufacturing method of the DLC diaphragm. Conventional PECVD needs to be performed under high temperature and vacuum conditions. Conventional PVD needs to be performed under vacuum conditions. The manufacturing process steps and devices are complicated, and the adhesion of the DLC diaphragm is poor due to residual thermal stress. It is often necessary to additionally employ an intermediate layer or add other elements for the deposition of the DLC diaphragm to solve the problem of poor adhesion, the manufacturing process steps are increased, and the adhesion is difficult to guarantee.

SUMMARY

Accordingly, it is necessary to provide a method of manufacturing a DLC vibrating diaphragm, which can improve adhesion of the DLC diaphragm and have simple manufacturing steps.

The present disclosure provides a method of manufacturing a DLC vibrating diaphragm, including the steps of:

placing a substrate in air, the substrate being a polymer material;

a step of depositing a DLC composite diaphragm including: introducing carbon-containing gas from one end of an atmospheric pressure plasma chemical vapor deposition device at a temperature of less than 90° C., providing a voltage of greater than 5 KV and less than 10 KV to ionize the carbon-containing gas, introducing a main gas from the other end of the atmospheric pressure plasma chemical vapor deposition device, taking the ionized carbon-containing gas out of the atmospheric pressure plasma chemical vapor deposition device by the main gas, and depositing the ionized carbon-containing gas on a surface of the substrate to form the DLC composite diaphragm; and a step of forming the DLC vibrating diaphragm including: cutting the DLC composite diaphragm into the DLC vibrating diaphragm having a required diameter DLC, and forming the DLC vibrating diaphragm having a required shape by a compressing process; or compressing the DLC composite diaphragm by a compressing process to form the DLC vibrating diaphragm having a required shape and diameter, and cutting the DLC vibrating diaphragm.

In one of the embodiments, prior to the step of depositing the DLC composite diaphragm, the method further includes maintaining a distance between a nozzle of the atmospheric pressure plasma chemical vapor deposition device and the substrate at 1 cm to 3 cm.

In one of the embodiments, the main gas is selected from the group consisting of dry clean air, nitrogen, and oxygen.

In one of the embodiments, the DLC diaphragm has a thickness of between 20 nanometers and 100 nanometers.

In one of the embodiments, the substrate has a thickness of between 9 micrometers and 50 micrometers.

Compared with conventional manufacturing methods of PECVD and PVD, the method of manufacturing the DLC vibrating diaphragm according to the present disclosure can achieve the deposition of the DLC vibrating diaphragm in an atmospheric pressure environment and a low temperature environment, there is no need for providing a vacuum cavity and a vacuum equipment, thereby simplifying the process. In addition, in the low temperature environment, a diaphragm break caused by high temperature or the diaphragm wrinkling due to thermal deformation can be avoided, thus the formed DLC vibrating diaphragm is more flat.

The present disclosure further provides a loudspeaker including a magnetic system, a voice coil, and the aforementioned DLC vibrating diaphragm. One end of the voice coil is connected to the DLC vibrating diaphragm, and the other end of the voice coil is inserted into a magnetic field generated by the magnetic system.

In the loudspeaker of the present disclosure, since the DLC vibrating diaphragm is manufactured by the foregoing method, compared with conventional manufacturing methods of PECVD and PVD, the method of manufacturing the DLC vibrating diaphragm according to the present disclosure can achieve the deposition of the DLC vibrating diaphragm in the atmospheric pressure environment and the low temperature environment, there is no need for providing the vacuum cavity and the vacuum equipment, thereby simplifying the process. In addition, in the low temperature environment, the diaphragm break caused by high temperature or the diaphragm wrinkling due to thermal deformation can be avoided, thus the formed DLC vibrating diaphragm is more flat. High-frequency performance of loudspeaker with this kind of DLC vibrating diaphragm is better.

DETAILED DESCRIPTION OF THE EMBODIMENTS

In order to facilitate understanding of the disclosure, the disclosure will be described more fully below with reference to the accompanying drawings. Preferred embodiments of the present disclosure are shown in the accompanying drawings. However, the present disclosure can be implemented in many different forms and is not limited to the embodiments described herein. On the contrary, it is an object of these embodiments to provide a more thorough understanding of the disclosure of the present disclosure.

It should be noted that when an element is referred to as being "fixed" to another element, it can be directly on the other element or it can be simultaneous presence of a central element. When an element is considered to be "connected" to another element, the element can be directly connected to the other element or it can be simultaneous presence of the central element. The terms "inside", "outside", "left", "right" and the like used herein are for illustrative purposes only and are not meant to be the only embodiment.

Figure 1:
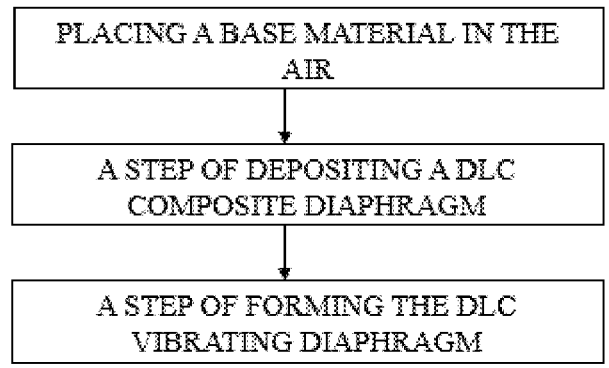
FIG. 1 is a first flowchart of a method of manufacturing a DLC vibrating diaphragm according to a first embodiment of the present disclosure.
Figure 3:
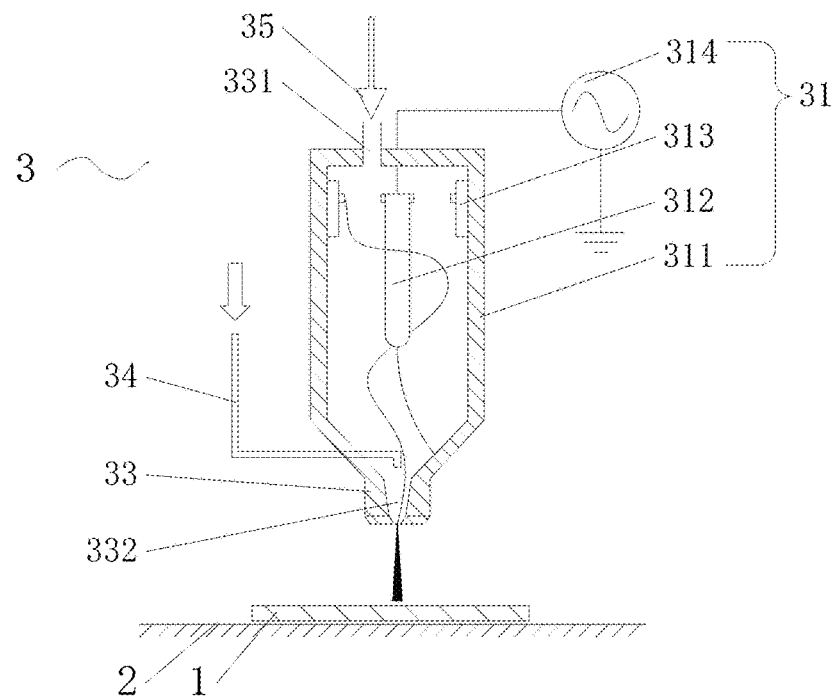
FIG. 3 is a schematic view of a device used in the method of manufacturing the DLC vibrating diaphragm according to the first embodiment of the present disclosure.

Referring to FIGS. 1 and 3, the present disclosure provides a method of manufacturing a DLC vibrating diaphragm, including the steps of:

A substrate 1 is placed in air, and the substrate is a polymer material. Preferably, the substrate is a thin film made of any one of the polymer materials selected from the group consisting of polyetherimide (PEI), polyethylene terephthalate (PET), polyetheretherketone (PEEK), polyphenylene sulfide (PPS), and polyurethane (PU). In addition, in the present embodiment, a working platform 2 is provided in an atmospheric pressure environment, and the substrate is placed on the working platform 2. In order to ensure that the substrate is fixed during the manufacturing process, the substrate 1 can be clamped to the working platform 2 by a fixture, or the substrate 1 can be adsorbed and fixed to the working platform 2 by a vacuum suction means.

A step of depositing a DLC composite diaphragm includes: a carbon-containing gas is introduced from one end of an atmospheric pressure plasma chemical vapor deposition device 3 at a temperature of less than 90° C., and a voltage of greater than 5 KV and less than 10 KV is provided to ionize the carbon-containing gas. A main gas is introduced from the other end of the atmospheric pressure plasma chemical vapor deposition device 3. The ionized carbon-containing gas is taken out of the atmospheric pressure plasma chemical vapor deposition device 3 by the main gas, and the ionized carbon-containing gas is deposited on a surface of the substrate to form the DLC composite diaphragm. Preferably, the carbon-containing gas and the main gas are simultaneously introduced from one end and the other end of the atmospheric pressure plasma chemical vapor deposition device 3, respectively. In alternative embodiments, the carbon-containing gas and the main gas are successively introduced into the atmospheric pressure plasma chemical vapor deposition device 3. In the present embodiment, after the carbon-containing gas is ionized by a voltage of greater than 5 KV and less than 10 KV, the number of charged particles per unit volume ranges from $10^{11}$ to $10^{13}$. Since the entire manufacturing method is carried out at the temperature less than 90° C., there is no residual thermal stress in the substrate 1, and the formed DLC composite diaphragm is very smooth and flat.

In the present embodiment, the carbon-containing gas is introduced into the atmospheric pressure plasma chemical vapor deposition device 3 to be ionized into a plasma state, and the carbon-containing gas in the plasma state after ionization is brought out of the device 3 through gas flow of the main gas and deposited on the surface of the substrate. Specifically, the carbon ions in the plasma state ionized from the carbon-containing gas are brought out by the gas flow of the main gas, and molecular rearrangement is performed on the surface of the substrate to form the DLC diaphragm. Preferably, the gas flow rate of the main gas is controlled within a range of 30 L/min to 40 L/min in a standard state (i.e., 1 atmospheric pressure, 25° C.), so that the carbon-containing gas in the plasma state after ionization can be well brought out and deposited on the surface of the substrate, thereby improving deposition efficiency.

A step of forming the DLC vibrating diaphragm includes: cutting the DLC composite diaphragm into the DLC vibrating diaphragm having a required diameter DLC, and forming the DLC vibrating diaphragm having a required shape by a compressing process. Specifically, in mass production, a plurality of DLC vibrating diaphragms are simultaneously cut from the whole DLC composite diaphragm, and are compressed to form the DLC vibrating diaphragm having a required shape after cutting, for example, a curved diaphragm. Alternatively, the DLC composite diaphragm is compressed by a compressing process to form the DLC vibrating diaphragm having a required shape and diameter, and the DLC vibrating diaphragm is cut. Specifically, in mass production, a plurality of the DLC vibrating diaphragms having the required shape and diameter are simultaneously compressed from the whole DLC composite diaphragm, and the DLC vibrating diaphragms are cut after compressing.

Figure 2:
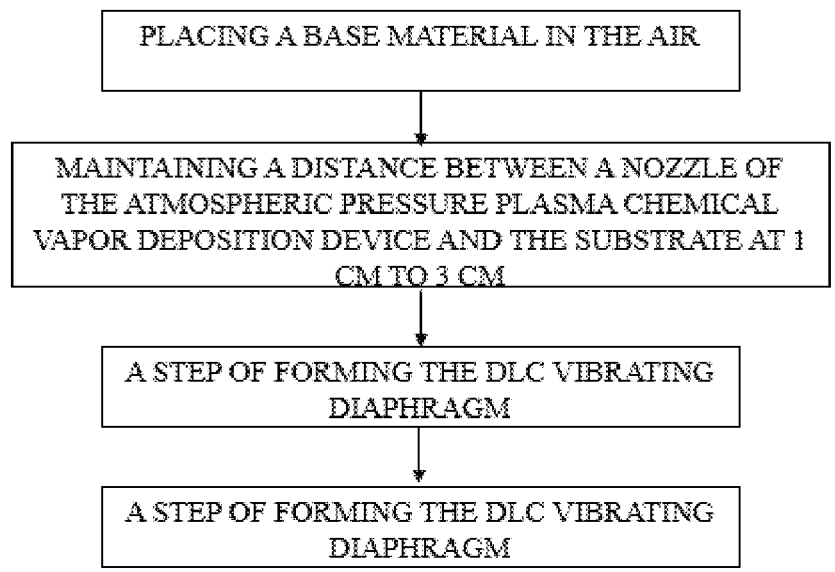
FIG. 2 is a second flowchart of the method of manufacturing the DLC vibrating diaphragm according to the first embodiment of the present disclosure.

In the present embodiment, referring to FIGS. 2 and 3, prior to the step of depositing the DLC composite diaphragm, the method further includes maintaining a distance between a nozzle 33 of the atmospheric pressure plasma chemical vapor deposition device and the substrate 1 at 1 cm to 3 cm. Specifically, a distance between an outlet 332 of the nozzle 33 of the atmospheric pressure plasma chemical vapor deposition device and the substrate 1 is maintained at 1 cm to 3 cm. The maintained distance depends on the scanning speed of the device and the supplied voltage. Preferably, when the scanning speed is 200 mm/s and the voltage is supplied at 6.5 KV, the distance is maintained at 1.5 cm.

In the present embodiment, referring to FIG. 3, the atmospheric pressure plasma chemical vapor deposition device 3 includes an ionization device 31, a controller, the nozzle 33, a main gas supplying system 35, a carbon-containing gas supplying system 34, and an exhausting system.

The ionization device 31 includes an alternating current (AC) power source 314, a housing 311, and electrodes located in the housing 311. The electrodes include a central electrode 312 located in the housing 311 and a first electrode 313 located on the housing 311. The AC power source 314 is coupled to the central electrode. Preferably, the first electrode 313 is located on an inner wall of the housing 311 and is grounded. The main gas supplying system 35 introduces the main gas from an inlet 331 of the nozzle, and the main gas flows in a spiral manner toward the nozzle 33 through a high-voltage electric field formed between the central electrode 312 and the first electrode 313.

The carbon-containing gas supplying system 34 introduces the carbon-containing gas from a side surface adjacent to the nozzle 33. A plasma generation zone is formed around the outlet of the carbon-containing gas, and a part of the carbon-containing gas is ionized in the plasma generation region formed by the high-voltage electric field generated between the central electrode 312 and the first electrode 313.

The controller controls the AC power source 314 to supply the voltage of less than 10 KV and greater than 5 KV to the central electrode, so as to generate the energy required to ionize the carbon-containing gas, thereby controlling the stability of the ionization.

The exhausting system recycles the main gas, the carbon-containing gas, and the ionized carbon-containing gas.

In the present embodiment, the main gas is one of dry clean air, nitrogen, and oxygen or any combination of the three, and the carbon-containing gas is alkane gas, olefin gas or alkyne gas.

In the present embodiment, the DLC diaphragm has a thickness of between 20 nanometers and 100 nanometers. If the thickness is less than 20 nm, the formed DLC vibrating diaphragm cannot have an effect of improving high-frequency performance. If the thickness is greater than 100 nanometers, the DLC diaphragm is easily dried into powder, and the effect of improving the high-frequency performance cannot be obtained.

Specifically, in the case where the distance between the nozzle of the atmospheric pressure plasma chemical vapor deposition device and the substrate is constant, the thickness of the DLC diaphragm is determined by the density of the carbon ions in the plasma state and the deposition residence time. Under the same density of the carbon ions in the plasma state, if the residence time is too long, the local diaphragm will be too thick, otherwise, the local diaphragm will be too thin.

Specific Example 1

A voltage of 6.5 KV was provided, and a distance between an outlet 332 of a nozzle 33 of an atmospheric pressure plasma chemical vapor deposition device and a substrate 1 was maintained at 1.5 cm, more than 95% of the carbon-containing gas can be ionized. A density of carbon ions in a plasma state reached about $10^{12}$, a scanning speed is 200 mm/s, a formed DLC diaphragm after scanning one back and forth had a thickness of 20 nm, a formed DLC diaphragm after scanning two back and forth had a thickness of 40 nm, a formed DLC diaphragm after scanning three back and forth had a thickness of 60 nm.

Specific Example 2

A voltage of 5 KV was provided, and a distance between an outlet 332 of a nozzle 33 of an atmospheric pressure plasma chemical vapor deposition device and a substrate 1 was maintained at 1.5 cm, more than 90% of the carbon-containing gas can be ionized. A density of carbon ions in a plasma state reached about $10^{11}$, a scanning speed is 150 mm/s, a formed DLC diaphragm after scanning one back and forth had a thickness of 20 nm, a formed DLC diaphragm after scanning two back and forth had a thickness of 40 nm, a formed DLC diaphragm after scanning three back and forth had a thickness of 60 nm.

Specific Example 3

A voltage of 10 KV was provided, and a distance between an outlet 332 of a nozzle 33 of an atmospheric pressure plasma chemical vapor deposition device and a substrate 1 was maintained at 1.5 cm, more than 99% of the carbon-containing gas can be ionized. A density of carbon ions in a plasma state reached about $10^{13}$, a scanning speed is 250 mm/s, a formed DLC diaphragm after scanning one back and forth had a thickness of 20 nm, a formed DLC diaphragm after scanning two back and forth had a thickness of 40 nm, a formed DLC diaphragm after scanning three back and forth had a thickness of 60 nm.

In the present embodiment, the substrate has a thickness of between 9 micrometers and 50 micrometers. If the substrate is less than 9 micrometers, the substrate is easily broken down during a coating process. If the substrate is greater than 50 micrometers, the substrate is not suitable for use as a diaphragm.

The following table provides a relationship between the thickness of the desired DLC diaphragm and the thickness of the desired substrate 1 and the high-frequency performance:

TABLE 1

| DLC Diaphragm Thickness (nanometer) | Substrate Thickness (micrometers) | High-frequency Performance Description |
| --- | --- | --- |
| 20 | 9 | high frequency extends to 40 KHz with small distortion |
| 20 | 12 | high frequency extends to 40 KHz with small distortion |
| 60 | 50 | high frequency extends to 40 KHz with small distortion |

Figure 4:
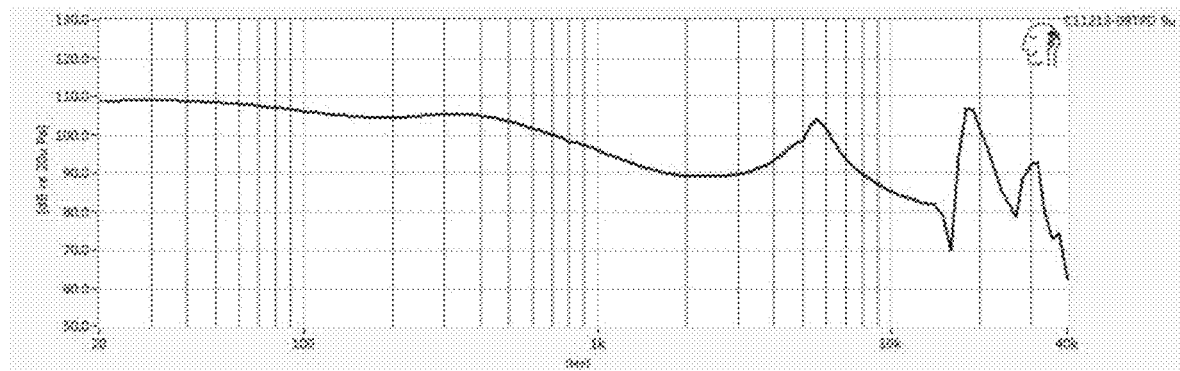
FIG. 4 is a frequency response curve of a DLC vibrating diaphragm according to one example of the method of manufacturing the DLC vibrating diaphragm according to the first embodiment of the present disclosure.
Figure 5:
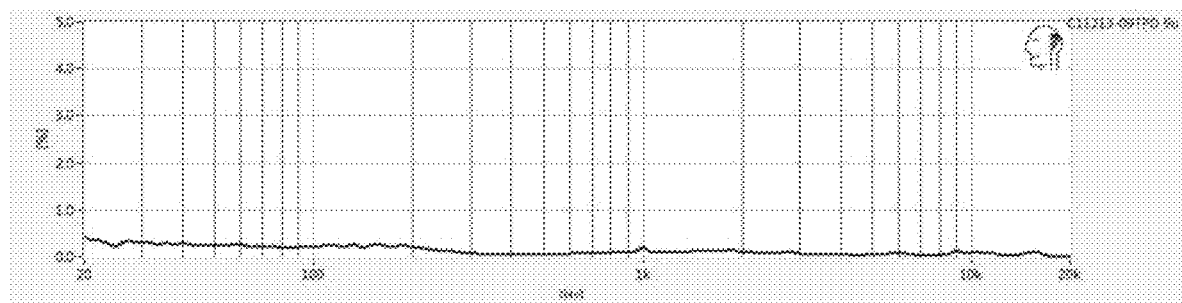
FIG. 5 is a distortion graph of the DLC vibrating diaphragm according to one example of the method of manufacturing the DLC vibrating diaphragm according to the first embodiment of the present disclosure.

Referring to FIGS. 4 and 5, when the DLC diaphragm has a thickness of 20 nm and the substrate has a thickness of 9 micrometers, the high frequency extends to 40 KHz and the distortion is small.

Figure 6:
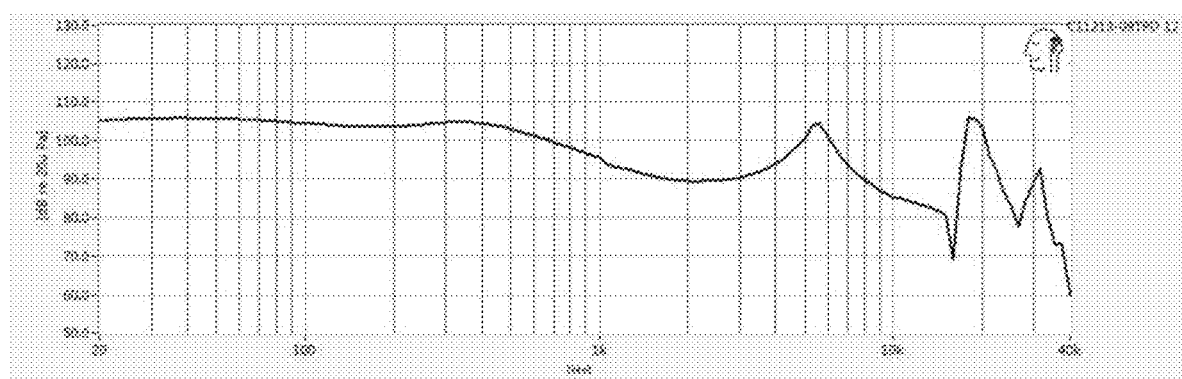
FIG. 6 is a frequency response curve of the DLC vibrating diaphragm according to another example of the method of manufacturing the DLC vibrating diaphragm according to the first embodiment of the present disclosure.
Figure 7:
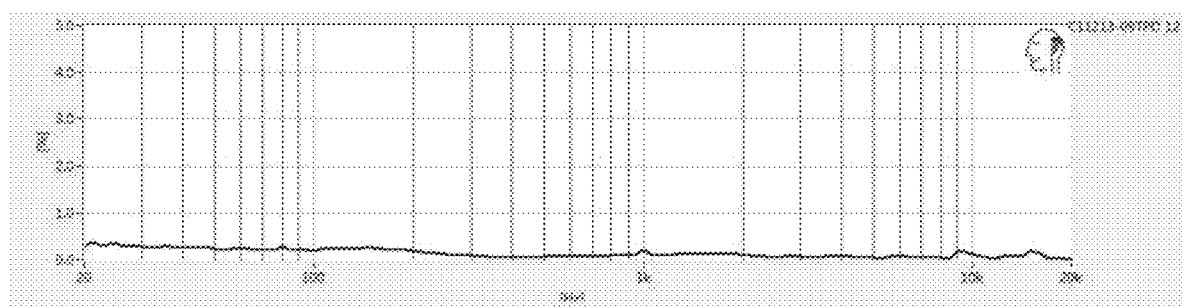
FIG. 7 is a distortion graph of the DLC vibrating diaphragm according to another example of the method of manufacturing the DLC vibrating diaphragm according to the first embodiment of the present disclosure.

Referring to FIGS. 6 and 7, when the DLC diaphragm has a thickness 20 nm and the substrate has a thickness of 12 micrometers, the high frequency extends to 40 KHz and the distortion is small.

Figure 8:
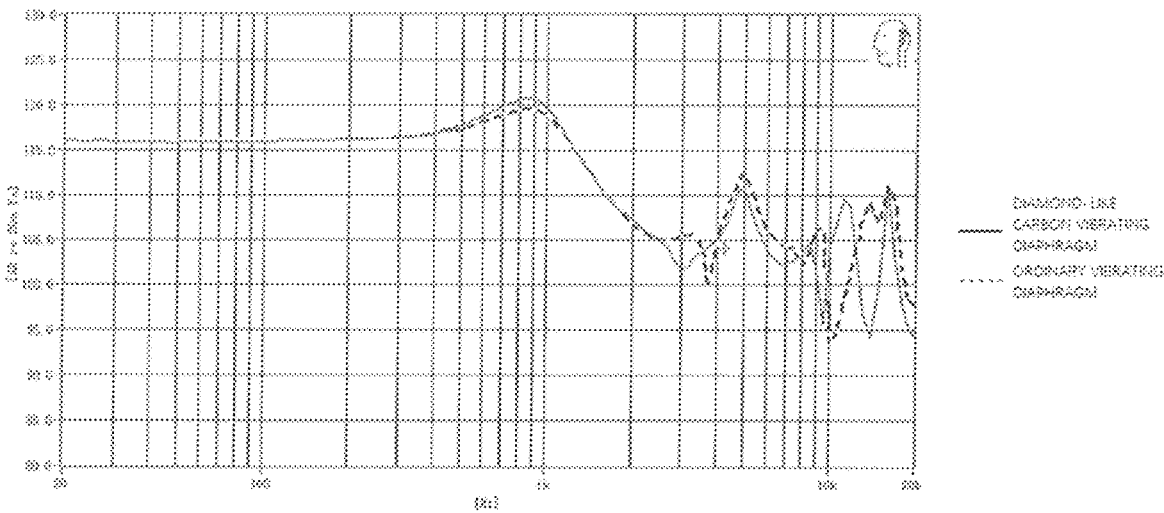
FIG. 8 is a frequency response curve of a conventional vibrating diaphragm and a DLC vibrating diaphragm according to a third example of the method of manufacturing the DLC vibrating diaphragm according to the first embodiment of the present disclosure.
Figure 9:
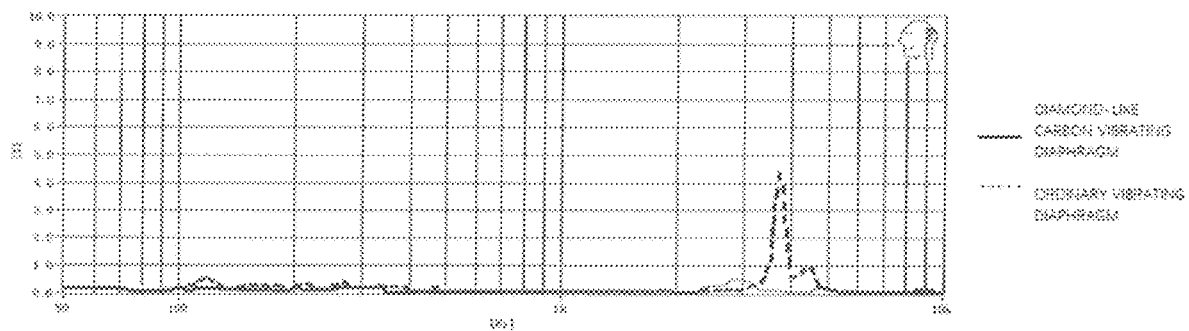
FIG. 9 is a distortion graph of the conventional vibrating diaphragm and the DLC vibrating diaphragm according to the third example of the method of manufacturing the DLC vibrating diaphragm according to the first embodiment of the present disclosure.

Referring to FIG. 8, when the DLC diaphragm has a thickness 60 nm and the substrate has a thickness of 50 micrometers, the DLC diaphragm has a better high frequency extension than that of a conventional vibrating diaphragm, and the overall balance between the low, medium, and high frequency responses is also better. Referring to FIG. 9, the conventional vibrating diaphragm has severe distortion between 3 KHz and 4 KHz, which will affect the sound quality performance. The DLC vibrating diaphragm has excellent distortion performance in the entire frequency domain, thereby contributing to the sound quality performance.

Compared with conventional manufacturing methods of PECVD and PVD, the method of manufacturing the DLC vibrating diaphragm according to the present disclosure can achieve the deposition of the DLC vibrating diaphragm in an atmospheric pressure environment and a low temperature environment, there is no need for providing a vacuum cavity and a vacuum equipment, thereby simplifying the process. In addition, in the low temperature environment, a diaphragm break caused by high temperature or the diaphragm wrinkling due to thermal deformation can be avoided, thus the formed DLC vibrating diaphragm is more flat.

The present disclosure further provides a loudspeaker including a magnetic system, a voice coil, and the aforementioned DLC vibrating diaphragm. One end of the voice coil is connected to the DLC vibrating diaphragm, and the other end of the voice coil is inserted into a magnetic field generated by the magnetic system.

In the loudspeaker of the present disclosure, since the DLC vibrating diaphragm is manufactured by the foregoing method, compared with conventional manufacturing methods of PECVD and PVD, the method of manufacturing the DLC vibrating diaphragm according to the present disclosure can achieve the deposition of the DLC vibrating diaphragm in the atmospheric pressure environment and the low temperature environment, there is no need for providing the vacuum cavity and the vacuum equipment, thereby simplifying the process. In addition, in the low temperature environment, the diaphragm break caused by high temperature or the diaphragm wrinkling due to thermal deformation can be avoided, thus the formed DLC vibrating diaphragm is more flat. High-frequency performance of loudspeaker with this kind of DLC vibrating diaphragm is better.

The technical features of the above-described embodiments can be arbitrarily combined. For the sake of brevity of description, all possible combinations of the respective technical features in the above-described embodiments have not been described. however, as long as there is no contradiction in the combination of these technical features, it should be deemed to be the scope of the specification.

The above-described embodiments represent only several embodiments of the present disclosure, the description of which is more specific and detailed, but is not to be construed as limiting the scope of the disclosure. It should be noted that, for those of ordinary skill in the art, several modifications and improvements can be made without departing from the concept of the present disclosure, which fall within the scope of the present disclosure. Therefore, the scope of protection of the disclosure patent shall be subject to the appended claims.

What is claimed is:

1. A method of manufacturing a diamond-like carbon (DLC) vibrating diaphragm, comprising the steps of:
   placing a substrate in air, the substrate being a polymer material;
   a step of depositing a DLC composite diaphragm comprising: introducing carbon-containing gas from one end of an atmospheric pressure plasma chemical vapor deposition device at a temperature of less than 90° C., providing a voltage of greater than 5 KV and less than 10 KV to ionize the carbon-containing gas, introducing a main gas from the other end of the atmospheric pressure plasma chemical vapor deposition device, taking the ionized carbon-containing gas out of the atmospheric pressure plasma chemical vapor deposition device by the main gas, and depositing the ionized carbon-containing gas on a surface of the substrate to form the DLC composite diaphragm; and
   a step of forming the DLC vibrating diaphragm comprising: cutting the DLC composite diaphragm into the DLC vibrating diaphragm having a required diameter DLC, and forming the DLC vibrating diaphragm having a required shape by a compressing process; or compressing the DLC composite diaphragm by a compressing process to form the DLC vibrating diaphragm having a required shape and diameter, and cutting the DLC vibrating diaphragm.

2. The method of manufacturing the DLC vibrating diaphragm of claim 1, wherein prior to the step of depositing the DLC composite diaphragm, the method further comprises maintaining a distance between a nozzle of the atmospheric pressure plasma chemical vapor deposition device and the substrate at 1 cm to 3 cm.

3. The method of manufacturing the DLC vibrating diaphragm of claim 1, wherein the main gas is selected from the group consisting of dry clean air, nitrogen, and oxygen.

4. The method of manufacturing the DLC vibrating diaphragm of claim 1, wherein the DLC diaphragm has a thickness of between 20 nanometers and 100 nanometers.

5. The method of manufacturing the DLC vibrating diaphragm of claim 1, wherein the substrate has a thickness of between 9 micrometers and 50 micrometers.

6. A loudspeaker, comprising a magnetic system, a voice coil, and a DLC vibrating diaphragm of claim 1, one end of the voice coil being connected to the DLC vibrating diaphragm, and the other end of the voice coil being inserted into a magnetic field generated by the magnetic system.

* * * * *